United States Patent [19]

Lewis et al.

[11] 3,925,077

[45] Dec. 9, 1975

[54] PHOTORESIST FOR HOLOGRAPHY AND LASER RECORDING WITH BLEACHOUT DYES

[75] Inventors: James M. Lewis, Aurora; Raymond W. Newyear, Willoughby, both of Ohio

[73] Assignee: Horizons Incorporated, Cleveland, Ohio

[22] Filed: Mar. 1, 1974

[21] Appl. No.: 447,267

[52] U.S. Cl. ................ 96/35.1; 96/27 H; 96/48 HD; 96/115 P

[51] Int. Cl.² .. G03C 5/00; G03C 5/04; G03C 5/24; G03C 1/68

[58] Field of Search ......... 96/35.1, 115 P, 27 H, 36, 96/48 HD; 117/34

[56] References Cited

UNITED STATES PATENTS

| | | | |
|---|---|---|---|
| 2,875,047 | 2/1959 | Oster | 96/35.1 |
| 3,102,027 | 8/1963 | Sprague et al. | 96/48 R |
| 3,495,987 | 2/1970 | Moore | 96/35.1 |
| 3,620,748 | 11/1971 | Fichter | 96/90 R |
| 3,667,946 | 6/1972 | Sturdevant | 96/27 H |
| 3,712,817 | 1/1973 | Hazy | 96/48 R |
| 3,769,023 | 10/1973 | Lewis et al. | 96/115 P |

*Primary Examiner*—David Klein
*Assistant Examiner*—Richard L. Schilling
*Attorney, Agent, or Firm*—Lawrence I. Field

[57] ABSTRACT

High photographic speed photoresists based on N-vinyl monomers are made capable of exhibiting broad spectral response between at least 3200 A and up to 11,000 A without loss of speed by incorporating therein one or more specific bleachout dyes. Any color produced as a consequence of exposure and development may be eliminated by blanket exposure after fixing to light or to a combination of light and heat. While these photoresist compositions are particularly suitable for the formation of relief phase holograms, generally called thin film surface reflection type holograms, thick phase holograms, optical components such as diffraction gratings, holographic tape for video cassette recording, microfiche type holograms and similar devices where the absence of color in the developed and fixed resist is important, these compositions are also suitable for the preparation of patterns whereby after suitable development, photomechanical milling may be accomplished for printing plates, printed circuits, microelectronic circuits and general chemical milling of metals, plastics and glass where the original pattern is formed in the photoresist placed on a suitable surface by the medium of scanning with a modulated or unmodulated laser beam of chosen wavelength and of relatively low power. The majority of applications, particularly photomechanical milling, require wet development. A significant property of these broad spectrum response photoresists is that they may be processed completely dry without the need for wet development and still yield high quality relief phase holograms both for holographic purposes and for formation of optical components and still retain the potential for complete bleaching of the sensitizing agents by treatment with ultraviolet light with or without the presence of heat or visible or other type of light representing the peak response of the bleachout dye at which wavelength the bleachout dye bleaches most rapidly.

14 Claims, No Drawings

PHOTORESIST FOR HOLOGRAPHY AND LASER RECORDING WITH BLEACHOUT DYES

SUMMARY OF THE DISCLOSURE

U.S. Pat. No. 3,769,023 and U.S. Pat. application Ser. No. 224,939 photoresist composition is dissolved in a binder which is taken from the class of the hydroxy alkyl celluloses, polyvinyl compounds such as vinyl esters, ketones and keto esters. The base composition, utilizing the types of binders just described, dissolved in a suitable solvent, includes (1) an N-vinyl monomer; (2) at least one compound which produces free radicals on exposure to light; (3) agents for improving the shelf stability of the product taken from the class of phenols, substituted phenols and triaryl compounds of the A sub group of metals taken from the fifth column of the Periodic Table.

In the form just described this composition has a photographic speed in the region of 0.5 to 2 mj/cm below approximately 4000 A. Above 4000 A, the sensitivity drops off with extreme rapidity to about zero at 4500 A.

Addition of relatively large concentrations of certain classes of bleachout dyes in a percentage range of 2 to 10 percent of the amount of the N-vinyl monomer extends the photographic response capability of the basic composition recited above up to at least 11,000 A without sensible loss of speed or, in other words, without speeds differing greatly from that exhibited in the ultraviolet region. Further, once exposed and developed to light of either a broad spectral character or to a specific wavelength as may be emitted by a laser, any residual color can be removed either by blanket exposure to the original processing light or to an ultraviolet light or to a combination of light and heat.

The activators which are most suitable for the purposes of our invention are substituted alkyl and aryl compounds which contain iodine, sulfonyl iodides, sulfenyl iodides and combinations thereof. Typical examples are iodoform, carbon tetraiodide, tetraiodoethylene, aryl sulfonyl iodides, aryl sulfenyl iodides, aryl iodides such as alpha, alpha diodotoluene and [1] diodo methyl furan.

Bleachout dyes and compounds suitable for the purposes of our invention which may be used alone or in combination include the (a) substituted anthraquinones; (b) bi-nuclear merocyanines, quaternarized merocyanines, quaternarized merocyanines, quaternary salts derived from merocyanines, styryl and butadienal dyes made from quaternary salts of merocyanines, pyrrolocyanines from quaternary salts of merocyanines, hemicyanines from quaternary merocyanines; (c) cyanine bases and dyes and particularly the sulfates, sulfonates, or iodides of such dye forms including symmetrical and unsymmetrical cyanines, symmetrical and unsymmetrical pyrrolocyanines, hemicyanines, carbocyanines, styrylcyanines, vinylene homologues of styrylcyanines; (d) salts of 9-phenylfluoren-9-ols; and (e) mixtures thereof.

Each of these dyes, dye bases and dye salts is characterized by the fact that it is relatively fugitive on exposure to light not only at its peak wavelength of initial absorbence but also to ultraviolet light and particularly in the presence of heat but also by the fact that the speed of bleaching out to a colorless form is radically increased by the presence of the activators listed heretofore.

When the dyes, except the substituted anthraquinones, are in the salt form, the sulfates, sulfonates and iodides not only are more active in maintaining photographic speed in the photopolymerizable compositions of this invention but the speed of bleaching is radically increased by the presence of activators of the type previously indicated. Dye salts based on acid radicals such as chloride, perchlorate, acetate, oxalate and the like are not only much more resistant to complete bleachout but do not act as sensitizers to the wavelength of their peak absorption to anywhere near the degree exhibited by the preferred activators. The substituted anthraquinones are most effective in the nonsalt form. The rapid bleachout characteristic is necessary not only for the eventual application of the system but for unknown reasons appears to be vital for maintenance of the full photographic speed of the total composition.

By virtue of their extraordinarily high photographic speed over an extremely broad range of wavelengths of the maintenance of this high speed photographic speed through addition of the bleachout dye and combinations thereof, and the capability for bleaching out all residual color by treatment with radiant energy of various types, these compositions are particularly suitable for laser recording and laser preparation of interference patterns which depend on the formation of a relief image, this being a significant characteristic of these specialized photoresists, whether processed by wet development or processed totally dry i.e. by simple exposure followed by heating. Thus, these materials are particularly suitable for laser exposures involving the formation of devices depending on interferometry, such as holograms, both one dimensional and three dimensional, optical components such as diffraction gratings, high density data storage, or mass digital data in compact form. In addition to the foregoing, these compositions can be used in generalized laser scanner-laser recorder techniques in which a modulated laser beam is utilizied for direct printing on the photoresist for the manufacture of offset printing plates, letterpress printing plates, manufacture of printed circuits, microelectronic circuits and the general field of photomechanical milling. In these applications, wet development is required in order to produce a pattern suitable for etching the underlying base.

Lasers which bracket the wavelength range of 3200 to 11,000 A, the range of the response of these modified photoresist compositions, are well known. They include but are not necessarily limited to the following: the nitrogen gas laser, the helium-cadmium laser, the argon ion laser, the helium-neon laser, the krypton gas laser, the yttrium garnet type lasers which may or may not be doped with neodymium, commonly designated as the YAG laser, the yttrium alumina laser with or without the neodymium doping, commonly designated as the YALO laser and others. Dye lasers are tunable to an extent that substantially any wavelength in the visible can be obtained. A further flexibility is available from the use of frequency doubling which involves the use of a specialized clear crystal placed in the path of the laser beam which has the capacity for doubling the frequency of the laser radiation thereby halving the wavelength at which the emitting light beam operates.

A great advantage of laser technology, especially if a highly responsive photoresist is available, is the extraordinary speed at which real information can be printed on the responsive surface by a combination of scanning and modulation techniques. Printing rates of several square feet per minute are readily obtained combined with extraordinary resolutions which may be in excess of 1000 lines per mm in view of the exceptionally small spot size to which a laser beam can be compressed and still retain extraordinary high power in such small spot size.

In summary, the photoresist composition containing the desired bleachout dye or desired combination of bleachout dyes is placed in a suitable solution and then laid down in a clean atmosphere by known techniques to yield a thin, extremely uniform layer of photoresist on a suitable substrate. The substrate is then printed by a suitably constituted laser beam to yield the various devices, procedures and objectives described in previous paragraphs. In certain instances, heating for brief periods of time at temperatures ranging between 100 to 160°C after exposure is sufficient to provide the necessary relief for interferometric devices such as holograms and diffraction gratings. Wet development with appropriate solvents is normally required when photomechanical milling is involved where the substrate has to be etched away to a desired extent by suitably constituted chemicals.

BACKGROUND OF THE INVENTION

A large patent literature exists dealing with the color and/or resist reactions which develop when combinations of certain complex organic amines and halogenated hydrocarbons in a suitable binder are exposed to light and thereafter processed. The first group of such patents, listed as Table 1 following, represent disclosures of prior art patents intended to be incorporated herein by reference.

TABLE 1

| UNITED STATES PATENTS (BACKGROUND NO. 1) | |
|---|---|
| 3,042,517 | 3,539,346 |
| 3,042,519 | 3,121,632 |
| 3,046,125 | 3,121,633 |
| 3,042,515 | 3,113,024 |
| 3,042,517 | 3,284,205 |
| 3,510,304 | 3,140,948 |
| 3,046,209 | 3,140,949 |
| 3,056,673 | 3,272,635 |
| 3,164,467 | 3,445,232 |
| 3,095,303 | 3,285,744 |
| 3,100,703 | 3,342,595 |
| 3,102,810 | 3,342,602 |
| 3,342,603 | 3,342,603 |
| 3,102,029 | 3,342,604 |
| 3,106,466 | 3,359,105 |
| 3,109,736 | 3,147,117 |
| 3,272,635 | 3,275,443 |
| 3,284,205 | 3,330,659 |
| 3,342,595 | 3,374,094 |
| 3,377,167 | 3,443,945 |
| 3,285,744 | 3,486,898 |
| 3,342,602 | 3,525,616 |
| 3,533,792 | 3,563,749 |

In general, these patents describe dry working compositions based on a combination of vinyl monomers including N-vinyl compounds, organic halogen compounds, and aryl amines dissolved in an organic binder which, when exposed to light, and suitably processed will produce a color. Other patents describe similar organic soluble compositions which may be utilized as photoresists which produce a color on processing and which are made available for a variety of photoresist purposes by treatment with organic solvents. A large number of these issued patents define compositions containing sources of free radicals which produce color on exposure to light either directly or as a consequence of heating or a combination of optical development and heating. In general the source of the color is a complex substituted amine, coupled with an activator or initiator. Compositions are described involving ethylenically unsaturated monomers and organic halogen compounds which produce free radicals on exposure to light and electron beam sensitive materials. Other patents disclose compositions involving organic halogen compounds and N-vinyl compounds in the base system and which contain aryl compounds of certain metals for the prevention of thermal fog on processing and on storage. Compositions useful for photoresist purposes and involving the use of crosslinking agents in a variety of binding agents are described. U.S. Pat. No. 3,374,094 describes a combination of N-vinyl compounds, free radical initiators and a variety of means for producing the necessary hydrophilic-hydrophobic requirement for yielding a planographic lithographic type printing plates. A number of these patents describe combinations of N-vinyl compounds, activators and certain organic amines for the purposes of producing color on exposure to light and suitable processing and which may be used for resist purposes by washing in an appropriate solvent with the color being retained.

Thus, though this large number of patents describe generally the use of N-vinyl monomers as the basic constituent in a free radical composition with a variety of additives, some of which compositions are utilized primarily for image formation purposes and others for resist purposes involving wash-off, in each case additives utilized for the formation of color are added deliberately to produce a color which is retained in the residual result whether wash-off procedures are used or not.

The concept of using colored compounds, dyes or dye bases of specific classes which as a consequence of exhibiting the specific property of a very rapid bleachout characteristic and thus provide an unusual degree of spectral sensitization to the basic compositions and permits the removal of the color effect of such dyes or dye bases as a consequence of a deliberately added bleaching reaction thereafter is not included in the patents listed in Table 1.

A more specific disclosure of prior art patents and patent applications, also intended to be incorporated herein by reference, are given in Table 2.

TABLE 2

UNITED STATES ISSUED AND PENDING PATENTS (BACKGROUND NO. 2)

3,000,833

3,102,027

3,104,973

3,578,456

3,620,748

3,712,817

3,769,023

Serial No. 224,939

U.S. Pat. No. 3,102,027 describes dyes and dye bases, principally of the merocyanine class, which are initially fugitive in nature on exposure to light but whose bleachout characteristics are accelerated substantially by the presence of specific classes of organic halogen compounds. In column 10 beginning with line 56, it is defined that the amount of organic halogen compound relative to the amount of bleachout dye in the composition may be a range from equal parts of weight up to 80 parts of organic halogen compound for each part of bleachout dye but with the understanding that up to 10,000 parts by weight of the bleachout accelerator may be present for each part of the bleachout dye by weight.

U.S. Pat. No. 3,104,973 again deals with dyes which are normally fugitive on exposure to light but whose bleachout characteristics are again accelerated by the presence of specific classes of organic halogen compounds. The dyes in this disclosure are principally of the cyanine class. Again, in column 8 beginning with line 5 of U.S. Pat. No. 3,104,973, the amount of organic halogen compound (bleachout accelerator) may be varied between 1 and 10,000 parts of the bleachout accelerator for each part of the bleachout dye by weight.

U.S. Pat. No. 3,620,748 is of particular interest in that dyes which might be considered as having bleachout characteristics and are utilized in the presence of N-vinyl monomers and organic halogen compounds and also used for extending the spectral range of photographic response of the base composition are included in the description without reference to the requirement that these dyes be of the bleachout nature. The amounts used are rigidly defined as critical and being required for use in very small quantities as defined beginning on lines 24 through about 40 of column 5 of U.S. Pat. No. 3,620,748. It is stated therein that the sensitizers are utilized in a range of 0.1 milligram to 2.0 milligrams per gram of monomer to develop the maximum degree of sensitizing effect with the minimum amount of color in the background and if too great quantity is added the sensitizers tend to color the background and some detail of the resulting image is lost in this colored background. It should be further noted that this patent describes an imaging system where every attempt is made to maintain the developed out color. No photoresist characteristics involving wash-off or the need for bleaching out the color is indicated.

The same comments may be made concerning U.S. Pat. Nos. 3,578,456; 3,712,817; 3,769,023; and Ser. No. 224,939. Again, dyes and dye bases are utilized for optical sensitization purposes and some of the dyes indicated may be considered as bleachout dyes. However, in the types of compositions utilized in these listed patent disclosures these normally fugitive dyes are used not only for optical sensitization purposes but also for extending the nature and degree of the permanent color formed. No indication is included in these disclosures of the requirement for bleachout characteristic, the specific advantage of the bleachout characteristic, and the need for bleaching out the dyes in a subsequent step in order to achieve a desired end result.

U.S. Pat. No. 3,000,833 describes a class of dyes, namely the salts of the 9-phenyl-fluoren-9-ols which are useful for the purposes of this disclosure and which have not been hitherto disclosed in other disclosures dealing with the use of N-vinyl monomers as the principal photoactive ingredient. The substituted anthraquinones also have not been disclosed heretofore in connection with these compositions. In addition, some of these substituted anthraquinones are not normally classed as dyes because of low tinctorial power, inability to adhere to a suitable substrate, and adverse reactions relative to the substrate causing undesired changes in color and tendering of the substrate particularly on exposure to sunlight.

DESCRIPTION OF THE INVENTION

A. The materials of the invention

The materials of the invention and their general method of placing them in form ready for use are given in Tables 3 through 9 and are effectively self-explanatory. Relative to Table 3, all the ingredients of the formulation are added to the solvent for the resin, with the exception of the bleachout component, prior to the addition of the resin. Once the solution of all these reagents with the exception of the bleachout component additive is complete, then the bleachout component in its appropriate solvent is added under light conditions to ensure the avoidance of premature exposure, after which the composition is placed in glass containers covered either with black paint or enclosed in a black completely light tight polyethylene bag. In the tables referred to, all of the ingredients of the base composition, with the exception of the bleachout component, are specifically delineated. Bleachout components are taken from the class of (a) the substituted anthraquinones, (b) the merocyanines and their variations, (c) cyanine dyes and bases and with particular reference to the sulfonates, sulfates and iodides, this restriction also applying to the dye salts of the merocyanines and, (d) similar salts of the 9-phenyl-fluoren-9-ols. Specific members and generic constitutions of these bleachout components will be listed in connection with the recitation of the examples.

The bleachout components described in this invention exhibit certain unique characteristics when utilized with the materials and process of this invention. The spectral absorption peaks are exceptionally sharp and narrow, much more so than when dyes of poor of nonbleaching characteristics are used; percentages substantially higher than normal for spectral sensitization are required; sensitivity to the base photoresist is imparted at or near the peak absorption of the bleachout component; and the evidence indicates that the bleachout component is an essential portion of the reaction mechanism.

The inference that the bleachout component is an integral portion of the reaction mechanism comes not only from the statement in the preceding paragraph but from the examination of the width of the absorption peak when these bleachout components are included in the compositions of this invention as compared to the width of the absorption peak of the bleachout component itself when dissolved in a solvent such as methanol, methylene chloride and the like without the presence of the other components constituting the compositions of this invention. This comparison is made by measuring the nanometer range of equivalent concentrations in the compositions of this invention versus identical concentrations in solvents such as methanol. The width of the peak is measured at a level of 75 percent of the total absorption at such peak. In the case of the bleachout component in the compositions of this invention the width of the peak is found usually in the range of 5 to 25 nanometers, whereas a similar measurement made on solutions of equivalent concentration without the presence of the other components defined in this invention yields peak widths of the order of 20 to 50 nanometers and sometimes as high as 100 nanometers. Further, the peak itself in the wavelengths of absorption is broad and somewhat diffuse as opposed to the extraordinary sharpness of peak absorption due to the bleachout component when included as part of the types of compositions defined in this invention.

TABLE 3

| ITEM NO. | BASE FORMULATION NAME | RANGE | PREFERRED |
|---|---|---|---|
| 1. | N-vinyl monomer (Table 4) | 200 to 600g | 300 to 350g |
| 2. | Iodine Containing Activator (Table 5) | 200 to 500g | 250 to 300g |
| 3. | Phenol Stabilizer (Table 6) | 20 to 60g | 30 to 35g |
| 4. | Resin Binder (Table 7) | 400 to 1000g | 400 to 600g |
| 5. | Bleachout Component (Table 8) | 2 to 10g per 100 grams of monomer | 5g per 100 grams of monomer |
| 6. | Solvent (Table 9) | 5 to 10 liters | 9 to 11 liters |

The bleachout component is added last in the form of a solution in which the solvent is highly polar and usually aprotic or is a mixture of such solvents and hydrocarbons such as xylene or toluene. Suitable solvents are alcohols, methylene chloride, N-methyl pyrollidone, dimethylformamide, tetrahydrofuran, acetonitrile, xylene, toluene, chlorbenzene alone and in mixture. Solvents for the substituted anthraquinones are generally chlorbenzene with or without the addition of either N-methyl pyrollidone or dimethylformamide. The other classes of dyes and dye salts are dissolved in methylene chloride, dimethylformamide or N-methyl pyrollidone. A 1 percent dye solution is utilized as the additive.

TABLE 4

THE POLYMERIZABLE MONOMERS (N-VINYL COMPOUNDS)

(A) (Heterocyclic
N-VINYL AMINES (heterocyclic and Aryl)
1. N-vinyl indole
2. N-vinyl carbazole
3. N-vinyl-phenyl - alpha - naphthylamine
4. N-vinyl pyrolle
5. N-vinyldiphenylamine (stabilized with 0.1% cyclohexylamine)

(B)
N-vinyl Amides and Imides
1. N-vinyl succinimide
2. N-vinyl phthalimide
3. N-vinyl pyrollidone
4. N-vinyl-N-phenylacetamide
5. N-vinyl-N-methylacetamide
6. N-vinyl diglycolimide
7. N-vinyl imidazole

TABLE 5

HALOGEN CONTAINING ACTIVATORS

1. Iodoform
2. Carbontetraiodide
3. Tetraiodoethylene
4. Tribromiodomethane
5. Alpha, alpha, di-iodotoluene
6. Alpha, alpha, alpha tri-iodotoluene
7. Aryl sulfonyliodides
8. Aryl sulfenyliodides
9. [1] Diodo methyl furan

TABLE 6

THE STABILIZERS

Suitable stabilizers include phenolic compounds such as those described in U.S. Patent No. 3,351,467 and may be represented by the general formula

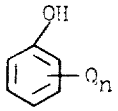

wherein Q may represent one or more hydroxyl groups, amino groups, alkyl and/or allyl groups, and $n$ is an integer not less than 1 and not greater than 5. When $n$ is greater than 1, all the Q's used need not be the same. Examples are:
1. 2,6 di-t-butyl cresol
2. p-aminophenol
3. catechol
4. 2,4 di-t-pentylphenol
5. 2,5-bis(1-1-dimethylpropyl)hydroquinone
6. 2,6 di-t-butyl-p-phenol
7. t-butyl hydroxyanisole

TABLE 7

THE RESIN BINDERS

1. Polyvinyl butyral
2. Polyvinylalcohol-vinylacetate
3. Polyvinyl acetate
4. Vinyl acetate - vinylchloride copolymer
5. Polyvinyl proprionate
6. Polyvinyl butyrate
7. Copolymer of polystyrene and polysulfone
8. Polyvinyl ketone
9. Copolymer of polyvinylbutyral-polyvinylalcohol-polyvinylacetate
10. Hydroxypropyl cellulose
11. Ethyl cellulose
12. Cellulose acetate butyrate

TABLE 8

SPECTRAL SENSITIZER-BLEACHOUT COMPONENT

Dyes, Dye bases and Dye Salts of the following classes:
Merocyanines (U.S. Pat. No. 3,102,027)
Cyanines (U.S. Pat. No. 3,104,973)
Substituted Anthraquinones
9-phenyl-fluoren-9-ols (U.S. Pat. No. 3,000,833)

When dye salts are used, they are taken from the class of iodides, sulfates and sulfonates. Chlorates, perchlorates, phosphates, oxalates, acetates, citrates, tartrates are ineffective. Chlorides and bromides show some degree of effectiveness but to a much lesser degree than the iodides, sulfates or sulfonates. The substituted anthraquinones are not used in the form of their dye salts.

TABLE 9

SOLVENTS (ALONE AND IN MIXTURE)

1. Chloroform
2. Cyclohexanone
3. Toluene:ethanol 3:2
4. Benzene:methanol 1:1
5. Butylacetate
6. Acetonitrile
7. Alkyl alcohols thru amyl alcohol
8. Methylene chloride
9. Cyclohexanol
10. Alcohol-water azeotropes
11. Methyl ethyl ketone
12. Methyl butyl ketone
13. Methyl cellosolve
14. N-methyl pyrrolidone
15. Dimethylformamide
16. Cyclic ethers B. The Method of the Invention The liquid prepared in accordance with the base formulation given in Table 3 is coated under light conditions insuring avoidance of premature exposure on an appropriate surface by techniques well known in the art, such as the use of doctor blades, wire wound doctor rods, dipping, spin coating and/or spraying. Wet coating thicknesses are selected depending on the eventual application, with wet thickness covering a range of approximately 0.5 mils up to 5 mils. After coating, the sample is then oven dried in a convection oven for 60 to 120 seconds at 30° to 40°C. The samples are then exposed on an imagewise basis to an appropriate light source. When lasers are utilized as the light source the material is deliberately sensitized so that the peak absorbance of the sensitizer is at or near the wavelength of the light emitted from the laser. After exposure, the samples are heated in a convection oven at temperatures ranging between 100° to 160°C for 60 seconds and then spray developed with methyl alcohol. The spray development operation requires approximately 10 seconds for each mil of original wet thickness. After development, the samples are then baked for 60 seconds at 100° to 160°C. The foregoing procedure is utilized when exposure is followed by photomechanical milling using appropriate etching agents.

In the normal preparation of holograms involving the materials and process of this invention, full development in the manner described in the previous paragraph sometimes leads to distortion difficulties as a consequence of poor adhesion to a particular transparent base. Transparent bases commonly used for these purposes are taken from the class of glass, quartz and plastic materials and the degree of adhesion is subject to variation not only as a consequence of the nature of the surface of these transparent bases but also as a consequence of minor variations in processing. This problem can be eliminated when wet development is utilized after proper exposure by carrying out the wet development sufficiently for an abbreviated period of time so that the unexposed resist between the exposed areas is not removed completely in the development process. We have further found that holograms of very high resolution can be made by this variation in technique. Whereas normal full development after first baking requires about 10 seconds for each mil of original wet thickness of resist, if a time period not exceeding 5 seconds and preferably not exceeding 3 seconds for spray development is utilized, an excellent relief pattern is obtained as a consequence of leaving a small and uniform thickness of unexposed resist in the troughs adjacent to the exposed areas. Under these conditions, the problems of distortion are eliminated without concern for the degree of adhesion to the transparent base.

Alternately, relief phase type holograms can be prepared by omitting the wet development step and the subsequent baking after wet development. As a consequence, with proper scanning techniques, the relief phase holograms are ready for use immediately after the first heat processing.

For straight photomechanical milling operations using ordinary photomasks, the procedure previously described in the prior art is utilized which involves full processing including the wet development step, after which the surface is then treated with an appropriate etchant which then forms the desired pattern on the substrate. Once etching is completed, the residual insoluble photoresist remaining on the pattern is removed by stripping, generally with methyl cellosolve.

Laser exposures are normally carried out by procedures known in the art. In the case of the usual laser scanner-laser recorder type of exposure, the desired copy is scanned with a helium-neon laser. The light reflected from the surface of the copy to be scanned is passed through appropriate lens and reflector systems into an optical encoder device which drives a modulator. The laser recording beam is passed through the modulator in a manner such as to then impose the beam in a suitable X–Y direction through appropriate and moving lens and reflector systems so as to duplicate the copy which had been previously scanned with the helium-neon laser. As a consequence of this kind of an arrangement the original image can be reproduced in either enlarged or reduced or the same size as the original image. A variety of methods for accomplishing scanning at suitable rates involve either rotating mirrors with the surface being scanned moving at predetermined rates, which is the usual practice for a flatbed scanner, or the rotating mirrors eliminated and the surface to be copied is placed on a drum rotating at very high speeds while the mirror and reflector assembly moves longitudinally past this drum at a predetermined rate.

Optical components such as gratings are made by somewhat similar techniques except that original copy is not normally required and the grating design on the sensitive surface is obtained simply through the combination of scanning in one direction while the surface being scanned is being moved at a predetermined rate at a direction right angles to a direction of scanning. The design is produced by using two beams from a laser which recombine on a mirror to produce interference patterns.

The preparation of the hologram generally involves the utilization of an interferometric technique. Original imagery is scanned by a laser as indicated previously and the light thus reflected from such scanning is then passed again into an optical encoder device which includes a Fourier transform mechanism which breaks up the image into a pattern of interference fringes. Again, this pattern of interference fringes is placed on a surface by modulation techniques as previously described. These interference fringes, which appear meaningless to the naked eye, are then read out as real information either by scanning with a laser beam or by flooding the entire surface with an expanded laser beam which is effectively stationary or, in some cases, using white light and/or fluorescent light for the purpose of reconstituting the imagery which is developed as a consequence of the presence of the interference patterns on the hologram.

In substantially all interferometric techniques involving the preparation of a hologram whether wet or dry developed, it is generally necessary that the interferometric pattern be substantially colorless and transparent whether the hologram is categorized as a thin planar device or a thick film device. In the thin planar device, the hologram is generally reconstituted into a real image by transmission, utilizing appropriate light sources and appropriate receiving surfaces, and sometimes by reflection. The thick film type is invariably viewed by reflection which requires that light to be passed down through the hologram with little or no absorption and strikes a reflective surface at the bottom of the hologram which then reflects the light back through again, thus, in effect, permitting a double passage of the light through the hologram. If any color or opacity is present this interferes drastically with the efficiency of diffraction and recovery in reconstitution of the real image made from the interferometric image.

The materials of this invention when produced in accordance with the foregoing descriptions not only have the capability for broad spectral response but also any residual color which may result as a consequence of the methods described heretofore can be removed by bleaching with light with or without the addition of heat. The most usual technique for bleaching purposes is the use of blanket flooding with ultraviolet light from a mercury light source, light in the range of 3000 to 4000 A being most effective. The blanket exposure when using ultraviolet light normally is of the order of 500 to 2000 millijoules per square centimeter if the specimen is bleached at room temperature. Suitable light sources are mercury lamps of low to medium pressure, high pressure mercury lamps, black light fluorescent lamps, GRS sunlamps with reflecting surfaces and the like. If the sample is heated to a temperature range of the order of 80° to 120°C during this bleaching operation, generally the amount of light required for total bleaching of the residual dye is approximately one-fifth that required when the sample is maintained at room temperature.

Similar results with regard to bleaching may be accomplished by utilizing light equivalent to the wavelength of peak absorption of the sensitizing bleachout component. Blanket exposures at this wavelength may be used in accordance with the procedure previously described for ultraviolet light with and without heat and again about the same amount of energy of exposure is required, or a laser beam having the desired wavelength may be used in a multiscanning mode to accomplish the same purpose both with and without heat on the base sample. As a consequence of such bleaching out the hologram appears to be colorless and transparent when viewed at right angles with the naked eye but images can be made available for visual viewing or other purposes when the hologram is suitably illuminated by light of a proper wavelength imposed and viewed in suitable directions.

As a consequence of the extremely wide variety of laser scannerlaser recorder and holographic techniques which have been developed and disclosed in the public literature, a wide variety of laser wavelengths are desired not only for scanning purposes but particularly for recorder and readout purposes. As indicated previously, the extremely broad wavelength of response available from the types of formulations which are defined in this specification makes it possible to achieve full utilization of all the various techniques involving lasers which have thus far been disclosed in the general open literature.

C. The sensitometric results obtained as a consequence of appropriate exposure of the formulations given in this specification The results obtained as a consequence of following the teachings of this specification are given primarily in the form of examples.

The base formulation utilized in these examples was as follows:

BASE FORMULATION (PRIOR ART)

Control (No bleaching sensitizer;) the dried, exposed, developed, and fixed formula is transparent and essentially colorless in the visible.

10,944 grams of 70 parts ethylalcohol, 15 parts propyl alcohol and 15 parts butyl alcohol
576 grams of polyvinyl butyral
31.92 grams of 2-6 di-t-butyl-p-cresol
319.20 grams of N-vinyl carbazole
268.80 grams of iodoform The base formulation and all subsequent examples containing bleachout sensitizers were coated at 1.5 mils wet on 1 oz. copper and then oven dried for 90 seconds at 35°C. The samples were then exposed to the wavelengths indicated in the examples using either a precision monochromater with a band width of 50 A or interference bandpass filters of a similar band width 0f 50 A. After exposure, the samples were heated at 160°C for 1 minute and then spray developed with methyl alcohol for 15 seconds. After development, they were baked for 60 seconds at 100°C and the sample was then spray etched with a mixture of 10 percent chromic acid and 20 percent sulfuric acid in water for a period of approximately 120 seconds at a temperature of 65°C, this usually being more than sufficient to etch completely through the copper. The substrate copper was laminated to an opaque polyester backing so that the portions of the copper which were protected by resist would remain in place. Exposure times were traversed so that a number of samples were prepared with the calibrated exposure units so that the minimum time of exposure required to achieve a full rendition of the photomechanically milled part could be determined. This is the figure in millijoules per square centimeter which is recorded in the tables of examples.

Examples 1 through 5 define the performance of this base formulation when exposed at different wavelengths and the useful photographic speed recorded. All succeeding samples (examples 6 through 90) involve the addition of a bleachout type sensitizer in amounts stated in these examples, the wavelength of special response imparted to the base formulation as a consequence of the addition of such a sensitizer, and the speed point in millijoules per square centimeter obtained at the wavelengths are recorded in the examples. As indicated previously, the sensitizer was added under appropriate light conditions in the form of a 1 percent solution of the sensitizer dissolved in an appropriate solvent as defined in Table 9.

The effect of the use of other vinyl monomers in equal weight replacement for N-vinyl carbazole, using Example 11 as the basis is defined in Examples 91 through 95. For some of these monomers the presence of oxygen acts as an inhibitor. For normal plate and frame exposure the effect of oxygen can be eliminated by making the exposure in a vacuum frame. For laser type exposures where vacuum frame exposure may be difficult and the laser beam is desired to impinge directly on the photosensitive surface without the intervention of another transparent surface such as glass or plastic, the effect of oxygen can be removed by insertion of the dried photosensitive system into a flowing current of carbon dioxide or nitrogen for a period of 10 minutes just prior to exposure. If desired, the flow of carbon dioxide over the surface of the photosensitive surface can be continued while the laser exposure is being carried out.

EXAMPLES (PRIOR ART)
CONTROL (NO BLEACHING SENSITIZERS)

| EXAMPLE NO. | WAVELENGTH | SPEED POINT mj/cm² |
|---|---|---|
| | A | |
| 1. | 3500 A | 1.0 |
| 2. | 4000 A | 1.25 |
| 3. | 4200 A | 2.50 |
| 4. | 4400 A | 10.0 |
| 5. | 4600 A | Zero |

EXAMPLES — THE PRESENT INVENTION

A. Bleachout class — substituted anthraquinones

Substituted anthraquinones which have been found suitable in the present invention are those represented by the general formula:

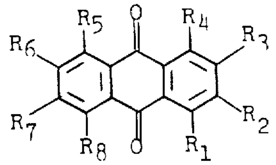

where $R_1$ thru $R_8$ may be at least one hydroxyl, amino, monoalkylamino, alky-arylamino, dialkyl amino, thiyl, benzamido, methoxy methoxybenzamido, napthamido, anthrimide, carbazole, quinoylurea, quinoline, thiazole, acetamido, alkyl, and halogen; when alkyl alone is used it is $R_2$ or $R_7$ and the balance of the R's are H; when halogen alone is used it is $R_2$ or $R_7$ and the balance are H; when amino, substituted amino or hydroxyl is used, the $R_1$ and $R_4$ positions are preferred though other R's may be filled, and if not the other R's are H; and $R_1$ through $R_8$ with the exceptions noted above may be the same or different.

DYE CLASS (A)

| EXAMPLE NO. | DYE | AMT. | WAVE-LENGTH A | SPEED POINT mj/cm² |
|---|---|---|---|---|
| 6. | $R_1$ and $R_4$ = diethylamino other R's = H | 15mg | 6400 A | 5 |
| 7. | $R_1$ = benzoamido other R's = H | 5mg | 4400 A | 0.5 |
| 8. | $R_1$,$R_4$,$R_5$ = amino other R's = H | 5mg | 6800 A | 5 |
| 9. | $R_1$,$R_4$,$R_5$,$R_8$ = amino other R's = H | 5mg | 7300 A | 3 |
| 10. | $R_1$ = amino, $R_4$ = hydroxy other R's = H | 5mg | 7000 A | 3 |
| 11. | $R_1$,$R_4$ = $NHC_5H_{11}$ other R's = H | 10mg | 6400 A | 5 |
| 11a. | $R_1$ = methylamino) $R_4$ = p-aminoanilino) other R's = H | 10mg | 7970 A | 6 |
| 11b. | $R_4$,$R_5$ = amino, $R_1$,$R_8$ = hydroxy other R's = H | 10mg | 7000 A | 4 |
| 11c. | $R_1$ and $R_4$ = hydroxy other R's = H | 5mg | 5000 A | 2 |
| 11d. | $R_{1,3,4,5,7,8}$ = hydroxy other R's = H | 5mg | 7500 A | 4 |
| 11e. | $R_1$ = amino, $R_4$ = $NHC_2H_5$ other R's = H | 5mg | 6400 A | 3 |

B. Dye class — Binuclear merocyanines which have been found suitable as sensitizers in the formulations of this invention are those represented by the general formula:

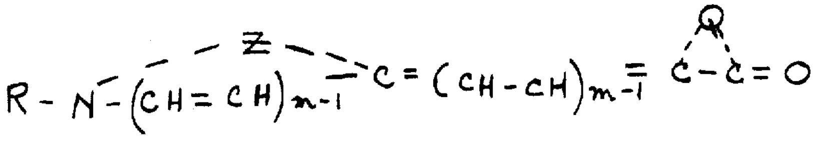

wherein R represents a member selected from the group consisting of alkyl and aralykyl groups (including carboxyalkyl and sulfoalkyl groups), *n* represents a positive integer from 1 to 2, *m* represents a positive integer from 1 to 4, [Z represents the non-metallic atoms necessary to complete a heterocyclic nucleus containing 5 to 6 atoms in the heterocyclic ring, ] and Q represents the non-metallic atoms necessary to complete a heterocyclic nucleus containing from 5 to 6 atoms in the ring. These are described in U.S. Pat. Nos. 3,102,027 (Col. 5) and 3,578,456 (Col. 3).

The heterocyclic nuclei (Q) contains 5 or 6 atoms in the ring and include rhodanines, oxazolediones, 2-thiohydantoins, alkyl and/or aryl pyrazalones, 4-thiazolidones, and thiazolones, and 1,3 indanethiones.

The Z nucleus may be a benzoxazole, benzothiazole, and other alkyl or aryl oxazoles and thiazoles, quinolines, pyridines, and dialkyl indolenine.

DYE CLASS (B)

| EXAMPLE NO. | DYE | AMT. | WAVE-LENGTH A | SPEED POINT mj/cm² |
|---|---|---|---|---|
| 12. | 3-ethyl-5[3-ethyl-2(3H)-benzoxazolylidene)-ethylidene]-rhodanine | 5mg | 4880 A | 5 |
| 13. | " | 15mg | 4880 A | 2 |
| 14. | " | 5mg | 5145 A | 6 |
| 15. | " | 15mg | 5145 A | 3 |
| 16. | 3-ethyl-5-[(1-methyl-4-(1H)-quinolylidene ethylidine] rhodanine | 5mg | 6100 A | 2 |
| 17. | " | 5mg | 6300 A | 3 |
| 18. | " | 5mg | 6500 A | 15 |
| 19. | " | 5mg | 7000 A | 40 |
| 20. | " | 15mg | 6100 A | 1 |
| 21. | " | 15mg | 6300 A | 1.5 |
| 22. | " | 15mg | 6500 A | 10 |
| 23. | " | 15mg | 7000 A | 25 |
| 24. | 2-[(3-ethyl-2-(3H)-benzoxazolylylidene)- | 5mg | 4880 A | 2 |
| 25. | 2-butenylidene-1,3-indanedione | 5mg | 5145 A | 2 |
| 26. | " | 5mg | 5500 A | 1 |
| 27. | " | 5mg | 6000 A | 2 |
| 28. | " | 5mg | 6100 A | 3 |
| 29. | " | 5mg | 6400 A | 8 |
| 30. | 5-(1-ethyl(1H)-quinolylidene)-3-ethyl-2-thio-2,4-oxazolidene dione | 5mg | 4400 A | 2.5 |
| 31. | " | 15mg | 4400 A | 1 |

(C) DYE CLASSES TAKEN FROM THE GROUP COMPLEX MEROCYANINES

Quaternized merocyanines; quaternary salts derived from merocyanine, unsymmetrical dyes from quaternary salts of merocyanines, styryl and butadienyl dyes from quaternary salts of merocyanines, pyrrolocyanines from quaternary salts of merocyanines, and hemicyanines derived from quaternized merocyanines where if an acid radical is present, it is taken from the class consisting of alkyl sulfate, aryl sulfonate and iodide. See: U.S. Pat. No. 3,102,027, Col. 7 thru 10.

DYE CLASS (C)

| EXAMPLE NO. | DYE | AMT. | WAVE-LENGTH A | SPEED POINT mj/cm² |
|---|---|---|---|---|
| 32. | 2-(p-dimethylaminostyril) 3,4 dimethylthiazolium-p-toluene sulfonate | 5mg | 4500 A | 3.0 |
| 33. | " | 5mg | 4800 A | 2.5 |
| 34. | " | 5mg | 5100 A | 5.0 |
| 35. | " | 15mg | 4500 A | 2.0 |
| 36. | " | 15mg | 4800 A | 1.5 |
| 37. | " | 15mg | 5100 A | 3.0 |
| 38. | 2(4-p-dimethylaminophenyl-1-3-butadienyl)benzothiazole metho-p-toluene sulfonate | 5mg | 5100 A | 15 |
| 39. | " | 5mg | 5400 A | 10 |
| 40. | " | 5mg | 5700 A | 15 |
| 41. | " | 15mg | 5100 A | 10 |
| 42. | " | 15mg | 5400 A | 5 |
| 43. | " | 15mg | 5700 A | 10 |
| 44. | 3-ethyl-5-[(3-ethyl-2(3) benzothiazolylidene)ethylidene] 2[cyano-2-quinolylmethylene] 4 thiazolidone | 5mg | 5200 A | 10 |

-continued

| EXAMPLE NO. | DYE CLASS (C) DYE | AMT. | WAVE-LENGTH A | SPEED POINT mj/cm² |
|---|---|---|---|---|
| 44. | 3-ethyl-5-[(3-ethyl-2(3) benzothiazolylidene)ethylidene[ 2[cyano-2-quinolylmethylene) 4-thiazolidone | 5mg | 5200 A | 10 |
| 45. | " | 5mg | 5600 A | 6 |
| 46. | " | 15mg | 5200 A | 6 |
| 47. | " | 15mg | 5600 A | 3 |
| 48. | 3-ethyl-5[2-(1 methyl-4-5-dihydro-B-naphthothiazolylidene) ethylidene]2(2-6-chloro-quinolylmethylene)4-thiazolidone | 5mg | 5000 A | 5 |
| 49. | 3-ethyl-5[1-ethyl-4(1H)quinolylidene)-2-butenylidene] rhodanine | 5mg | 7000 A | 10 |
| 50. | " | 5mg | 7970 A | 200 |
| 51. | " | 15mg | 7000 A | 5 |
| 52. | " | 15mg | 7970 A | 100 |
| 53. | 3-ethyl-5 l[B-(ethyl-5,6-dimethyl-2(3)-benzothiazolylidene)-a-ethyl-ethylidene-2-[3-ethyl-4-methyl-5-phenythiazole-ethiiodide)-methylidene]-4-thiazolidone | 5mg | 6000 A | 3 |
| 54. | " | 5mg | 6500 A | 5 |
| 55. | " | 5mg | 7000 A | 8 |
| 56. | " | 15mg | 6000 A | 1.5 |
| 57. | " | 15mg | 6500 A | 3 |
| 58. | " | 15mg | 7000 A | 4 |

EXAMPLE 59

5 mgs each of dyes from examples 12, 16, 30, 47 and 51 are added to the base formula of Example 1 dissolved in 3.0 cc's of methylene chloride. After preparation, exposure and completion as in Example 1, spectral response was found to be essentially flat (between 1 and 2 mj/cm² from 3200 to 7500 A) dropping off to approximately 50 mj at 8000 A.

EXAMPLES (Continued)

DYE CLASS (D)

Dye class — cyanines (See: U.S. Pat. No. 3,104,973) bases and dyes including the sulfonates and iodides of (a) symmetrical and unsymmetrical cyanines; (b) symmetrical and unsymmetrical pyrrolocyanines; (c) hemicyanines; (d) carbo-cyanines; (e) styryl cyanines; and vinylene homologs of styryl cyanines.

| EXAMPLE NO. | DYE | AMT. | WAVE-LENGTH A | SPEED POINT mj/cm² |
|---|---|---|---|---|
| 60. | 4-[(3-methyl-2(3H)-benzothiazolidene) methyl]quinoline hydro-p-toluene sulfonate | 5mg | 5000 A | 5 |
| 61. | " | 15mg | 5000 A | 2 |
| 62. | 3,3',4'-trimethyl-oxathiazolo carbo-cyanine iodide | 5mg | 5000 A | 5 |
| 63. | " | 15mg | 5000 A | 2 |
| 64. | 1,1'-dimethyl-4,4'-Carbocyanine-p-toluene sulfonate | 5mg | 6400 A | 35 |
| 65. | " | 5mg | 7000 A | 17 |
| 66. | " | 15mg | 6400 A | 10 |
| 67. | " | 15mg | 7000 A | 5 |
| 68. | 4-[3-ethyl-2(3H)benzo-thiazolylidene)propenyl] quinoline hydroiodide | 5mg | 4880 A | 10 |
| 69. | 4-[3-ethyl-2(3H)benzo-thiazolylidene)propenyl] quinoline hydroiodide | 5mg | 6200 A | 10 |
| 70. | 1,1',3,3,3',3' hexamethyl indodicarbocyanine-p-toluene sulfonate | 5mg | 6400 A | 8 |
| 71. | " | 5mg | 7000 A | 35 |
| 72. | 3,3' diethylthiadicarbo-cyanine iodide | 5mg | 6400 A | 8 |
| 73. | " | 5mg | 7000 A | 8 |
| 74. | " | 5mg | 7970 A | 100 |
| 75. | 3,3' diethylthiatricarbo-cyanine iodide | 5mg | 6400 A | 5 |
| 76. | " | 5mg | 7970 A | 100 |
| 77. | 2-(p-dimethylaminostyryl) | 5mg | 4800 A | 2 |

-continued

| EXAMPLE NO. | DYE | AMT. | WAVE-LENGTH A | SPEED POINT mj/cm² |
|---|---|---|---|---|
| | 3-4 dimethyl thiazolium-p-toluene sulfonate | | | |
| 78. | 2(4-p-dimethylaminophenyl-1-3 butadienyl)benzothiazole metho-p-toluene sulfonate | 5mg | 5400 A | 10 |
| 79. | 2-[1-cyano-5(3-ethyl-2(3H) benzoxazolylidene)1-3 penta-dienyl]benzothiazole | 5mg | 5400 A | 5 |
| 80. | 4[7-3-ethyl-2[3H]benzothiazo-lylidene)1-3-5 heptatrienyl] quinoline | 5mg | 4800 A | 10 |
| 81. | 2[(3-ethyl-2(3H)benzothiazo-lylidene)ethylidene]amino-benzothiazole | 5mg | 4600 A | 5 |
| 82. | p-dimethylaminobenzylidene-2,2'dibenzothiazolyl methane | 5mg | 4400 A | 1 |
| 83. | 4-4'-vinylidene-bis-(N,N-dimethylaniline) iodide | 5mg | 6200 A | 10 |

EXAMPLE 84

5 mgs each of dyes from Example 12 (Class B) and from Example 72 (Class D) dissolved in 3.0 cc's of dimethylformamide are added to the base formula. After preparation, exposure and completion as in Example 1, spectral response was found to be essentially flat, approximately 1 mj/cm², from 3200 to 7200 A dropping off to approximately 30 mj/cm² at 8000 A. This is a clear case of synergism.

EXAMPLES (Continued)

DYE CLASS (E)

Dye Class (E) are the iodides, sulfates and sulfonates of the 9-phenyl-fluoren-9-ols of the formula:

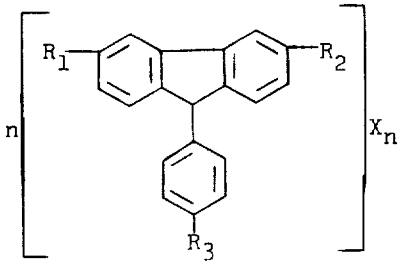

wherein each $n$ is either 1 to 2; X represents an iodide, sulfate or sulfonate; each of $R_1$, $R_2$, and $R_3$ are $NH_2$, H, $OCH_3$ or dialkylamino, at least two being $NH_2$ or dialkylamino and X is an anion and in which one or more of the aromatic hydrogens may be replaced by alkyl, alkoxy, halogen, nitro, acetamido, acetyl, or sulfonamido radicals.

The dye salts are relatively stable in solution and the photopolymerizable solutions containing these materials do not require refrigeration to maintain their stability during storage prior to exposure.

| EXAMPLE NO. | DYE | AMT. | WAVE-LENGTH A | SPEED POINT mj/cm² |
|---|---|---|---|---|
| 85. | the para-toluene sulfonate salt of 3,6-bis(dimethyl-amino)-9-phenyl-fluoren-9-ols | 5mg | 9000 A | 3 |
| 86. | " | 5mg | 10,000 A | 3 |
| 87. | " | 5mg | 11,000 A | 10 |
| 88. | the iodide salt of 3,6 dimethylamino)-9-(2-methoxy-5-iodo-phenyl)fluoren-9-ols | 5mg | 9000 A | 2 |
| 89. | " | 5mg | 10,000 A | 2 |
| 90. | " | 5mg | 11,000 A | 4 |

OTHER VINYL MONOMERS IN EQUAL AMOUNTS IN PLACE OF N-VINYL CARBAZOLE OF EXAMPLE 11

| EXAMPLE NO. | MONOMER | ATMOSPHERE | WAVE-LENGTH | SPEED POINT mj/cm² |
|---|---|---|---|---|
| 91. | N-vinylphthalimide | $CO_2$ | 6400 A | 5 |
| 92. | N-vinylimidazole | $CO_2$ | 6400 A | 2 |
| 93. | N-vinylindole | Air | 6400 A | 2 |
| 94. | N-vinylpyrollidone | $CO_2$ | 6400 A | 5 |
| 95. | N-vinylsuccinimide | $CO_2$ | 6400 A | 1 |

EXAMPLE 96

Equal parts by weight of hydroxy propyl cellulose were used as a replacement for the polyvinylbutyral utilized in example 11. The solvent used for placing the various ingredients in solution was comprised of 10 liters of equal parts by weight of benzene and methanol. Exposure was carried out at 6400 A in air and a speed point of 2 mj/cm² was obtained.

Having described our invention in general and specific terms, we claim:

1. A process for producing a relief image which comprises:

1. preparing a photoresist composition comprising:
   - at least one N-vinyl monomer;
   - at least one organic iodine containing compound selected from the group consisting of alkyl iodides, aryl sulfenyl iodides, aryl sulfonyl iodides, α-αdiiodotoluene and α-α-αtriiodotoleune;
   - a phenol represented by the formula

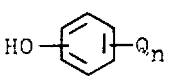

where *n* is an integer from 1 to 5 and each Q is selected from the group consisting of hydroxyl, amino, alkyl and allyl;

- and at least one bleachout component selected from the group consisting of: (a) substituted anthraquinones, (b) binuclear merocyanines, (c) complex merocyanines, (d) cyanines, and (e) 9-phenyl-fluoren-9-ols;
   - each of the above constituents being dispersed or dissolved in a resin binder;
   - and in which the relative amount of said bleachout component is in the range of 2 to 10% by weight of the amount of N-vinyl monomer;
2. depositing a thin film of said composition on a suitable substrate;
3. printing on said thin film by means of a laser beam;
4. then heating said film whereby a relief image is obtained by totally dry means; and
5. then blanket exposing the film to suitable radiation to bleachout any color present in said film.

2. The process of claim 1 wherein the printing is effected by a combination of scanning and modulation of the laser beam.

3. The process of claim 1 wherein bleaching is effected at room temperature.

4. The process of claim 1 wherein bleaching is effected while the film is heated to a temperature of about 80° to 120°C.

5. The process of claim 1 wherein bleaching is by means of radiation from UV source.

6. The process of claim 1 wherein bleaching is by radiation approximating to the wavelength of peak absorption of the sensitizing bleachout component.

7. The product produced by the process of claim 1.

8. A process which comprises:

1. preparing a photosensitive composition suitable for use as a photoresist comprising:
   - at least one N-vinyl monomer;
   - an iodine containing activator selected from the group consisting of alkyl iodides, aryl sulfenyl iodides, aryl sulfonyl iodides, α-α-diiodotoluene, α-α-α-triiodotoleune, and diiodo-methyl-furan;
   - a phenol represented by the formula

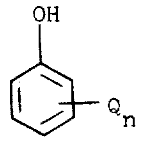

where *n* is an integer from 1 to 5 and each Q is selected from the group consisting of hydroxyl, amino, alkyl and allyl;

- at least one bleachout component selected from the group consisting of: (a) substituted anthraquinones, (b) binuclear merocyanines, (c) complex merocyanines, (d) cyanines, and (e) 9-phenyl-fluoren-9-ols;
   - each of the above constituents being dispersed or dissolved in a resin binder to form a coating solution;
2. wet coating a suitable, clean substrate with a layer of said solution between about 0.1 and 5.0 mils wet thickness;
3. drying the layer;
4. subjecting said layer to an imagewise exposure to a dose of image forming radiation;
5. developing the resulting image by applying heat to said layer; and then
6. bleaching any color formed in said layer by blanket exposure of said layer to radiant energy.

9. The process of claim 8 including in addition, further developing the relief image formed by said heating step (5) by spraying said layer with methyl alcohol.

10. The process of claim 8 wherein the heating is at temperatures between about 100° and 160°C after exposure (printing).

11. The process of claim 9 followed by baking at 100° to 160°C for up to two minutes.

12. The process of claim 9 followed by etching the surface of said film.

13. The product produced by the process of claim 9.

14. The process of claim 8 wherein the bleaching is effected by exposure to radiation in the band extending from ultraviolet to red.

* * * * *